(12) United States Patent
Kwon et al.

(10) Patent No.: US 10,692,542 B2
(45) Date of Patent: *Jun. 23, 2020

(54) COATED SLIDER TO INHIBIT CONTAMINATION ACCUMULATION

(71) Applicant: Seagate Technology LLC, Cupertino, CA (US)

(72) Inventors: Byung Seok Kwon, San Jose, CA (US); David Ellison, Minneapolis, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/723,618

(22) Filed: Dec. 20, 2019

(65) Prior Publication Data

US 2020/0135240 A1   Apr. 30, 2020

Related U.S. Application Data

(63) Continuation of application No. 15/988,282, filed on May 24, 2018, now Pat. No. 10,522,192.

(60) Provisional application No. 62/510,327, filed on May 24, 2017.

(51) Int. Cl.
| | |
|---|---|
| *G11B 33/14* | (2006.01) |
| *B32B 15/20* | (2006.01) |
| *B32B 9/00* | (2006.01) |
| *C09D 1/00* | (2006.01) |
| *G11B 5/48* | (2006.01) |
| *G11B 5/40* | (2006.01) |
| *C01F 7/00* | (2006.01) |
| *C23C 16/455* | (2006.01) |

(52) U.S. Cl.
CPC ............ *G11B 33/1446* (2013.01); *B32B 9/00* (2013.01); *B32B 15/20* (2013.01); *C09D 1/00* (2013.01); *G11B 5/40* (2013.01); *G11B 5/4833* (2013.01); *B32B 2250/03* (2013.01); *C01F 7/002* (2013.01); *C23C 16/45525* (2013.01)

(58) Field of Classification Search
CPC ........ G11B 33/1446; B32B 9/00; B32B 15/20
USPC .............................................. 360/235–235.5
See application file for complete search history.

(56) References Cited

U.S. PATENT DOCUMENTS

| | | |
|---|---|---|
| 6,954,978 B1 | 10/2005 | Crowder et al. |
| 7,123,448 B1 | 10/2006 | Boutaghou et al. |
| 7,193,805 B1 | 3/2007 | Haddock |
| 7,237,535 B2 | 3/2007 | Eick et al. |
| 7,357,875 B2 | 4/2008 | Feng et al. |
| 8,208,228 B2 * | 6/2012 | Maat ...................... B82Y 10/00 360/314 |
| 9,123,366 B2 | 9/2015 | Stoebe et al. |
| 9,153,256 B2 | 10/2015 | Rajasekharan et al. |
| 9,245,562 B1 | 1/2016 | Liu et al. |

(Continued)

FOREIGN PATENT DOCUMENTS

JP            05274638 A       5/2012

*Primary Examiner* — Allen T Cao
(74) *Attorney, Agent, or Firm* — Holzer Patel Drennan

(57) ABSTRACT

A slider is provided with a conformal coating (e.g., an oxide) on the air-bearing surface (ABS) to provide a consistent surface energy to the ABS. The conformal coating may be formed by an atomic layer deposition (ALD) process. A consistent surface energy inhibits accumulation of contaminants on the slider ABS, such as at topographical transition areas.

19 Claims, 8 Drawing Sheets

(56) References Cited

U.S. PATENT DOCUMENTS

| | | |
|---|---|---|
| 9,437,233 B1 | 9/2016 | Olson et al. |
| 2004/0100730 A1* | 5/2004 | Okai ................... G11B 5/1278 360/125.62 |
| 2011/0279926 A1 | 11/2011 | Si et al. |
| 2015/0020379 A1 | 1/2015 | Engelkes et al. |
| 2015/0154988 A1 | 6/2015 | Takei et al. |
| 2015/0325263 A1 | 11/2015 | Stoebe et al. |

* cited by examiner

COATED SLIDER TO INHIBIT CONTAMINATION ACCUMULATION

CROSS-REFERENCE

This application is a continuation of U.S. patent application Ser. No. 15/988,282 filed May 24, 2018, now U.S. Pat. No. 10,522,192, and claims priority to, and the benefit of, U.S. provisional patent application 62/510,327 filed May 24, 2017, the entire disclosures of which are incorporated herein by reference for all purposes.

BACKGROUND

Hard disc drives are common information storage devices having a series of rotatable discs that are accessed by magnetic reading and writing elements. These data reading and writing elements, commonly known as transducers, or merely as a transducer, are typically carried by and embedded in a slider that is held in a close relative position over discrete data tracks formed on a disc to permit a read or write operation to be carried out.

As distances between the slider and the disc decrease, due to the ever-growing desire to reduce the size of the disc drive and to pack more data per square inch, the potentially negative impact due to contamination that might be on the slider increases. Unwanted contaminants on the slider can adversely affect fly height behavior, such as with elevated or decreased fly height, create fly asymmetry in roll or pitch character, produce excessive modulation, and even result in head-disc contact or crashing, all possibly due to contaminant build up on the slider. All of these mechanisms result in degraded performance of the read or write operation of the slider (e.g., skip-writes, modulated writers, weak writes, clearance stability and settling, and incorrect clearance setting).

What is needed is a mechanism to inhibit, remove and/or control contaminants from between the slider and the disc surface.

SUMMARY

This disclosure is directed to controlling the surface potential of the slider to inhibit accumulation of contaminants on the slider air-bearing surface (ABS).

One particular implementation described herein is a slider having a body with an air-bearing surface (ABS) having a topography including recessed areas and raised areas. The slider has a working surface comprising a first material (e.g., as a coating on the slider body) having a first surface energy and a second material (e.g., as a coating on the slider body) having a second surface energy different than the first surface energy, and a constant-thickness oxide coating on the working surface. In some implementations, over the oxide coating is a self-assembled monolayer (SAM) coating.

Another particular implementation described herein is a method of making a slider, the slider having a body with an air-bearing surface (ABS) having a topography including recessed areas and raised areas. The method includes applying an oxide coating via a conformational coating technique on the ABS; and applying a self-assembled monolayer coating on the oxide coating. The conformational coating technique can be an atomic layer deposition (ALD) process.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

BRIEF DESCRIPTION OF THE DRAWING

The described technology is best understood from the following Detailed Description describing various implementations read in connection with the accompanying drawing.

DETAILED DESCRIPTION

Figure 1:
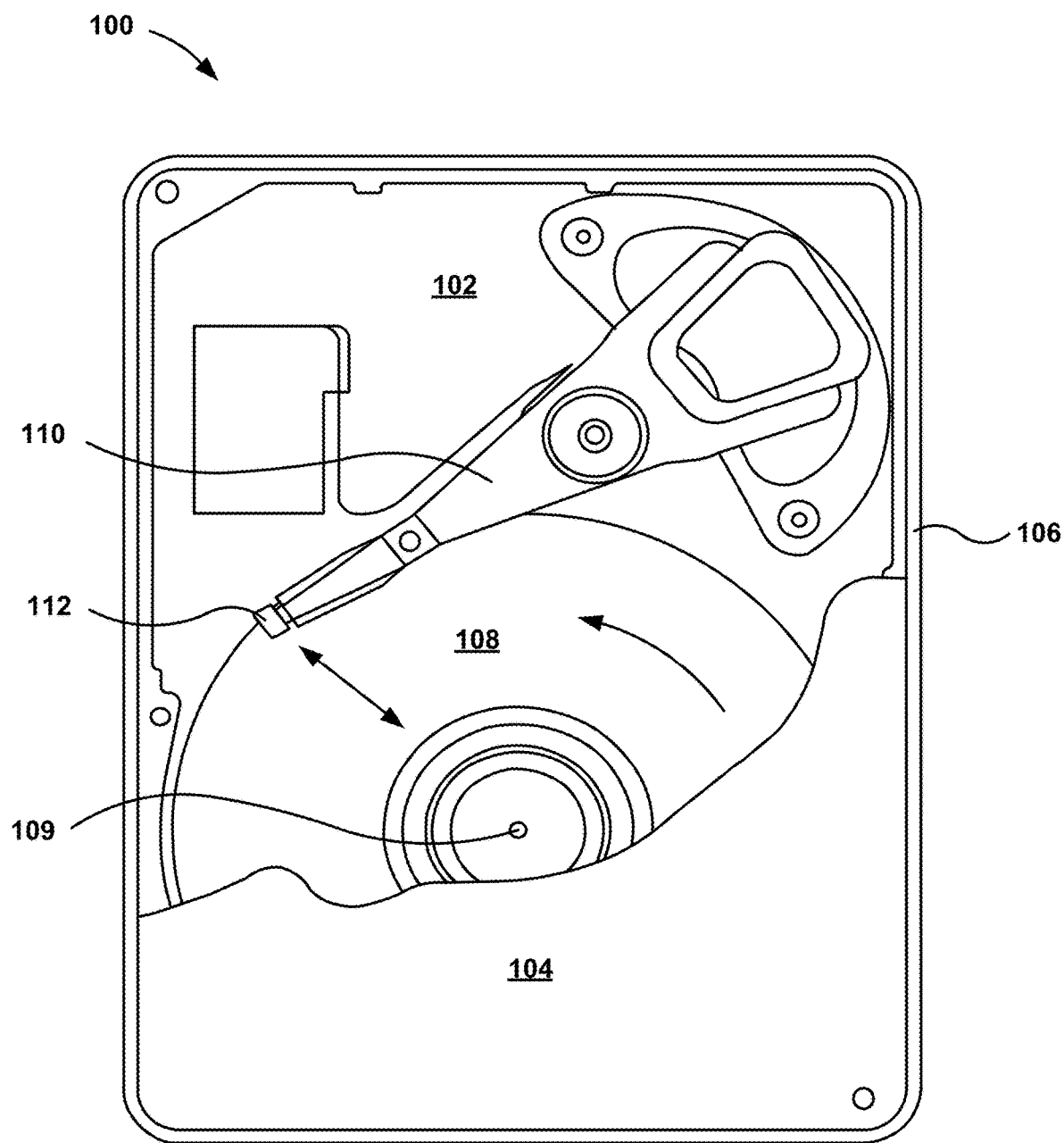
FIG. 1 is a schematic, top plan view of a hard disc drive.

Hard disc drives are common information storage devices having of a series of rotatable discs that are accessed by magnetic reading and writing elements. These data elements, commonly known as transducers, or merely as a transducer, are typically carried by and embedded in a slider that is held in a close relative position over discrete data tracks formed on a disc to permit a read or write operation to be carried out. As distances between the slider and the disc decrease, due to the ever-growing desire to reduce the size of the disc drive and to pack more data per square inch, the potentially negative impact of any contamination that might be present between the slider and the disc increases. Unwanted contaminants can adversely affect fly height behavior of the slider, which could lead to elevated or decreased fly height, fly asymmetry in roll or pitch character, excessive modulation, and head-disc contact or crashing due to contaminant build up and accumulation on the slider and/or "bridging" mechanisms between the head and disc. All of these mechanisms result in degraded performance of the read and/or write operation of the head (e.g., skip-writes, modulated writers, weak writes, clearance stability and settling, and incorrect clearance setting).

The present disclosure provides a slider having a surface coating on the air-bearing surface (ABS) that standardizes the surface potential of the ABS, regardless of the topography (e.g., high aspect ratio features), the slider material(s) and any coating(s), to inhibit accumulation of contaminants on the ABS, particularly at regions of changing topography.

The term "contaminant" refers to any unwanted or undesired material or substance present on the storage medium, even if such substance is placed on the article intentionally. For example, in many implementations, lubricants such as hydrocarbon based oils and greases are intentionally applied to the surface of carbon coated discs to improve the flying height of the slider in relation to the disc. Droplets or otherwise unattached or "free" lubricant on the disc is undesired, and is a contaminant readily removed from the disc surface by the devices and methods of the present disclosure. Contaminants that can be removed by the device include, but are not limited to, disc lubricants, organic materials (e.g., solvents), silicones, silica, talc, and particulates.

In the following description, reference is made to the accompanying drawing that forms a part hereof and in which is shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Referring to FIG. 1, an exemplary magnetic disc drive 100 is schematically illustrated. The disc drive 100 includes a base 102 and a top cover 104, shown partially cut away. The base 102 combines with the top cover 104 to form a housing 106, in which is located one or more rotatable magnetic data storage media or discs 108. The magnetic storage media 108 are attached to a spindle 109 for co-rotation about a central axis. It should be noted that a pack of multiple discs or media 108 is utilized in some implementations, and only a single disc or medium 108 is used in other implementations. Each disc or medium surface has an associated slider 112 that is mounted adjacent to and in communication with its corresponding disc or media 108. The slider 112 includes a data reading transducer and a data writing transducer (also referred to as read/write heads, transducers, and the like), which read and write data to concentric tracks on the storage disc or media 108. An actuator assembly 110 supports the slider 112 and positions the slider 112 and its read/write transducers over a desired data track on the disc or media 108.

In accordance with the implementations of this disclosure, present on the surface of the slider that is opposite the disc 108, which is the surface often referred to as the air-bearing surface (ABS), is a coating that provides a constant and standardized surface potential to the surface. This coating is present across the ABS, including the advanced air-bearing (AAB) surface.

The coating is a conformal coating, having a constant thickness. By use of the phrase "constant thickness," what is intended is a constant thickness within the parameters of the conformal coating technique used. Additionally, in some implementations, "constant thickness" means that that there is no more than 2 nm variation in the thickness of the coating, in some implementations no more than 1 nm variation. An example of a conformal coating technique or method is atomic layer deposition (ALD). ALD commonly produces coatings having a thickness variation no more than 0.1 nm per cycle.

The conformal coating is a non-metallic, non-electrically conductive material, such as a dielectric. In some implementations, the conformal coating is an oxide, e.g., silicon oxide ($SiO_2$), aluminum oxide ($Al_2O_3$). The conformal coating is no more than 200 nm thick, in some implementations less than 100 nm, and at least 0.2 nm thick, in some implementations at least 0.5 nm thick. Example non-limiting coating thicknesses include 0.5-50 nm, 1 nm-50 nm, 10-50 nm, 20-50 nm, and 10-20 nm.

In some implementations, the surface, either all or a portion thereof, includes a self-assembled monolayer coating or SAM coating, selected with an affinity for a class of contaminants (e.g., an oleophilic SAM for the removal of oil-based contaminants). The SAM coating is provided over the conformal coating. The SAM may, e.g., alter the surface properties of the ABS from what was provided by the conformal coating.

Figure 2:
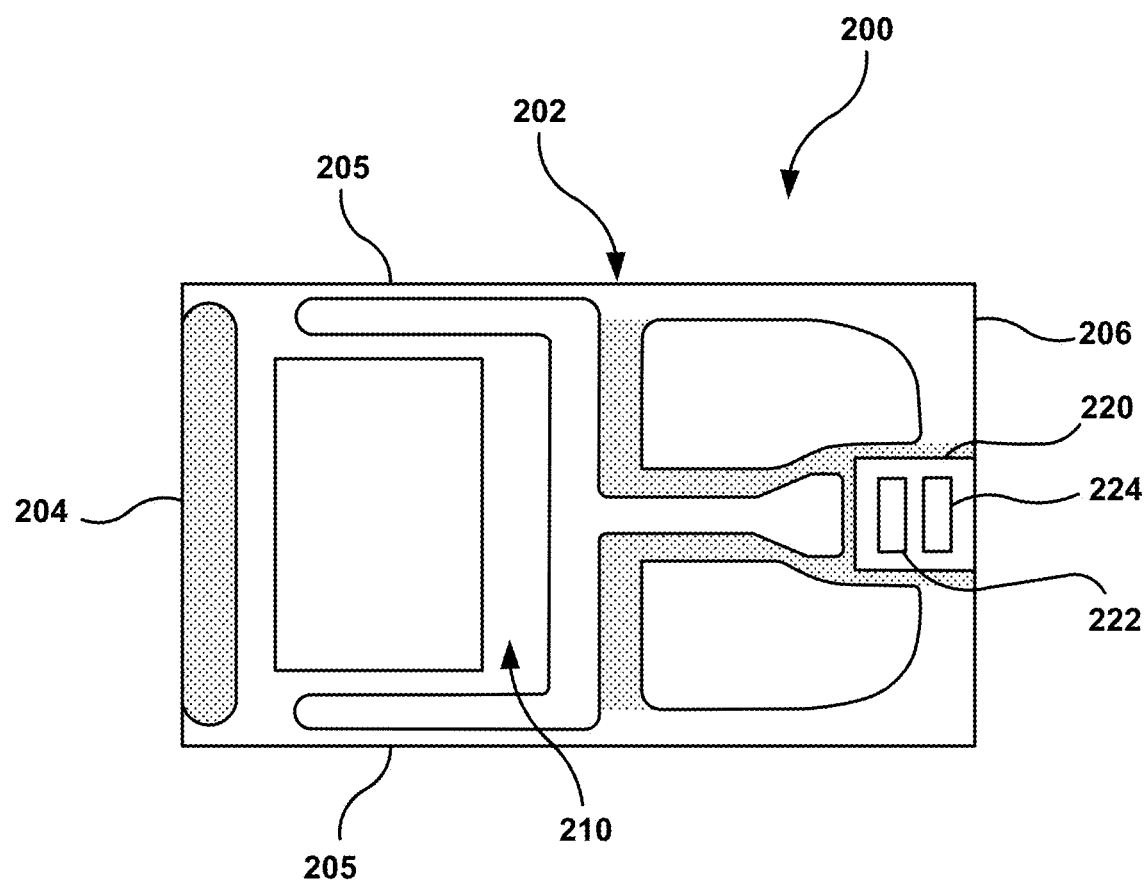
FIG. 2 is a schematic, bottom plan view of an example slider.

FIG. 2 illustrates an example topography implementation of a slider ABS. A slider 200, enlarged to show various topographical features such as the read head, the write head, the air bearing surface (ABS), rails, and/or the entire advanced air bearing (AAB) surface, is shown.

The slider 200 has a slider body 202 defined by a leading edge 204, a trailing edge 206 and two side edges 205 connecting the leading edge 204 and the trailing edge 206 of the body 202. The slider body 202 has an air bearing surface (ABS) 210 that is the surface of the body 202 that is closest to and opposing the media 108 when the slider 200 is incorporated into a disc drive 100. The ABS 210 has a topography designed to control the aerodynamic performance of the slider 200 as it flies over rotating media 108. In particular, the ABS 210 includes structural features such as rails, lands, ramps, trenches, depressions and the like that are designed to affect the air-bearing surface pressure created by the stream of air flowing between the ABS 210 and the rotating media 108. In this particular implementation of FIG. 2, the shaded features are higher than the non-shaded features, which are recessed into the body 202 in relation to the raised features. In other words, the shaded features are closer to the media 108 than the non-shaded features, when the slider 200 is incorporated into a disc drive. In the illustrated implementation, although only two levels are illustrated, as shaded and non-shaded, it should be understood that either level, the shaded or non-shaded, may have multiple sublevels.

The slider 200 includes a transducer 220 that is proximate to or at the trailing edge 206 of the slider body 202; the transducer 220 includes at least one read head 222 and at least one write head 224. In some implementations, all or part of the transducer 220 is present on the trailing wall of the slider body 202.

Figure 3:
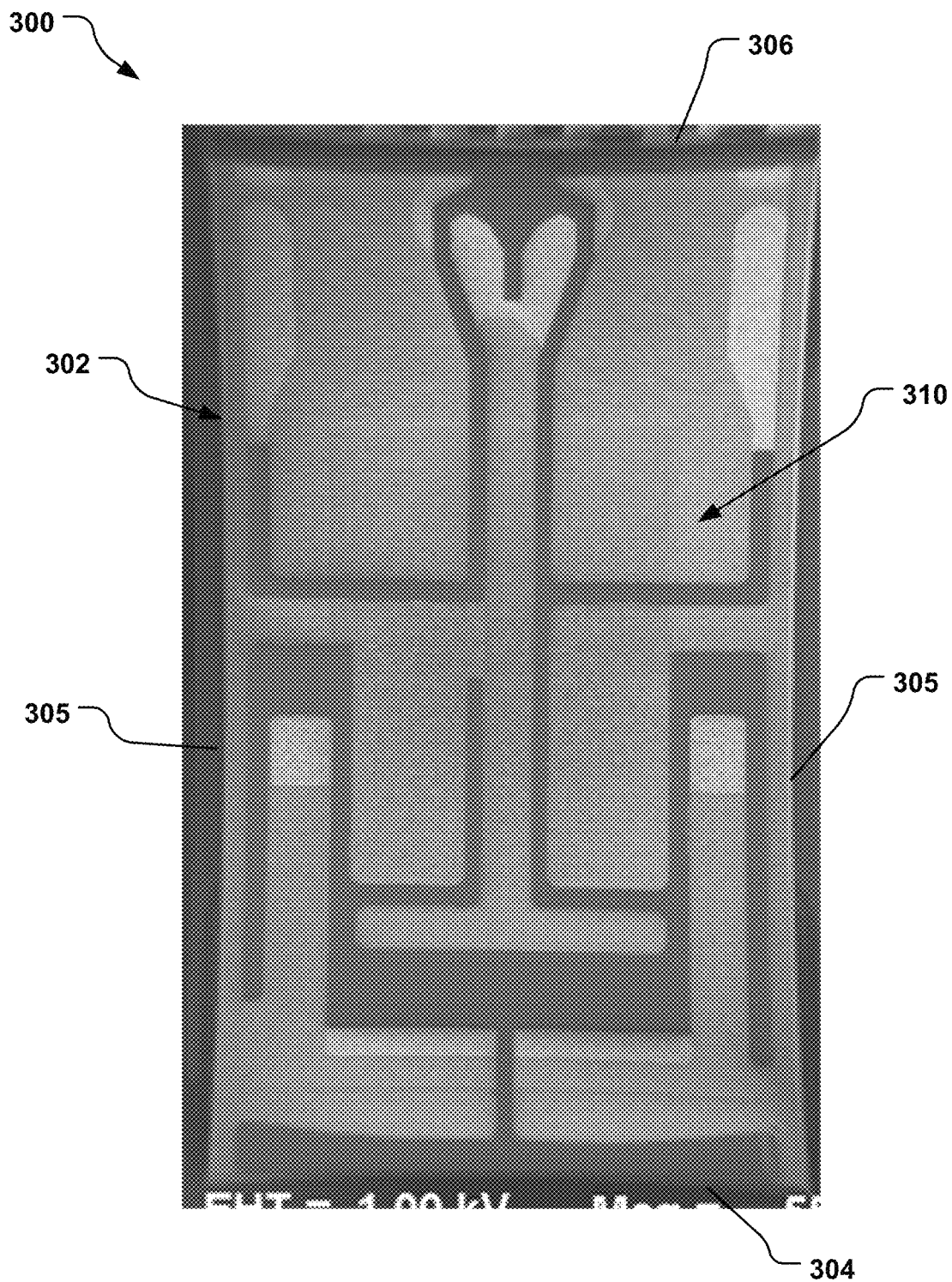
FIG. 3 is a photomicrograph, bottom plan view of another example slider.

FIG. 3 is a photomicrograph of an SEM (scanning electron microscope) image that illustrates another example topography implementation of a slider ABS. A slider 300, enlarged to show various topographical features such as the air bearing surface (ABS) or rails, and/or the entire advanced air bearing (AAB) surface, is shown. The slider 300 has a slider body 302 defined by a leading edge 304, a trailing edge 306 and two side edges 305 connecting the leading edge 304 and the trailing edge 306 of the body 302. The slider body 302 has an ABS 310. The ABS 310 has a topography defined by structural features designed to control the aerodynamic performance of the slider 300 as it flies over a rotating media in a disc drive. In this particular implementation, three topographical levels of features are shown; the dark features are higher than the medium features, which are higher than the light features. In other words, the features have a distance to the media 108 that is stepped, with the darker the feature the closer to the media 108, when the slider 300 is incorporated into a disc drive. (It is noted that the black or very dark shading around the slider body 302 is the background of the photomicrograph and is not a part of the slider 300).

Although only two particular implementations of sliders have been illustrated in FIGS. 2 and 3, it is understood that the slider may have any number of various alternate configurations of, e.g., location, dimension, etc. of topographical features such as rails and trenches, the location of the transducer, and the arrangement of the read head(s) and write head(s).

In the two implementations of sliders shown in FIGS. 2 and 3, at least two of the various levels of the features are formed from different materials. As an example, the slider 200 has the higher (shaded) features formed from a first material and the lower or recessed (non-shaded) features formed from a second material. The first material and/or the second material may be present as a layer or coating on the body forming the overall slider, thus the coating forms the feature(s), or the entire structure of the feature(s) may be formed from that material. As an example, the higher features may be formed by a layer placed on the body of the slider, whereas the lower features are defined by the body itself; in such an example, the higher features are formed of a first material (the coating) and the lower features are formed of a second material (the body).

Figure 4:
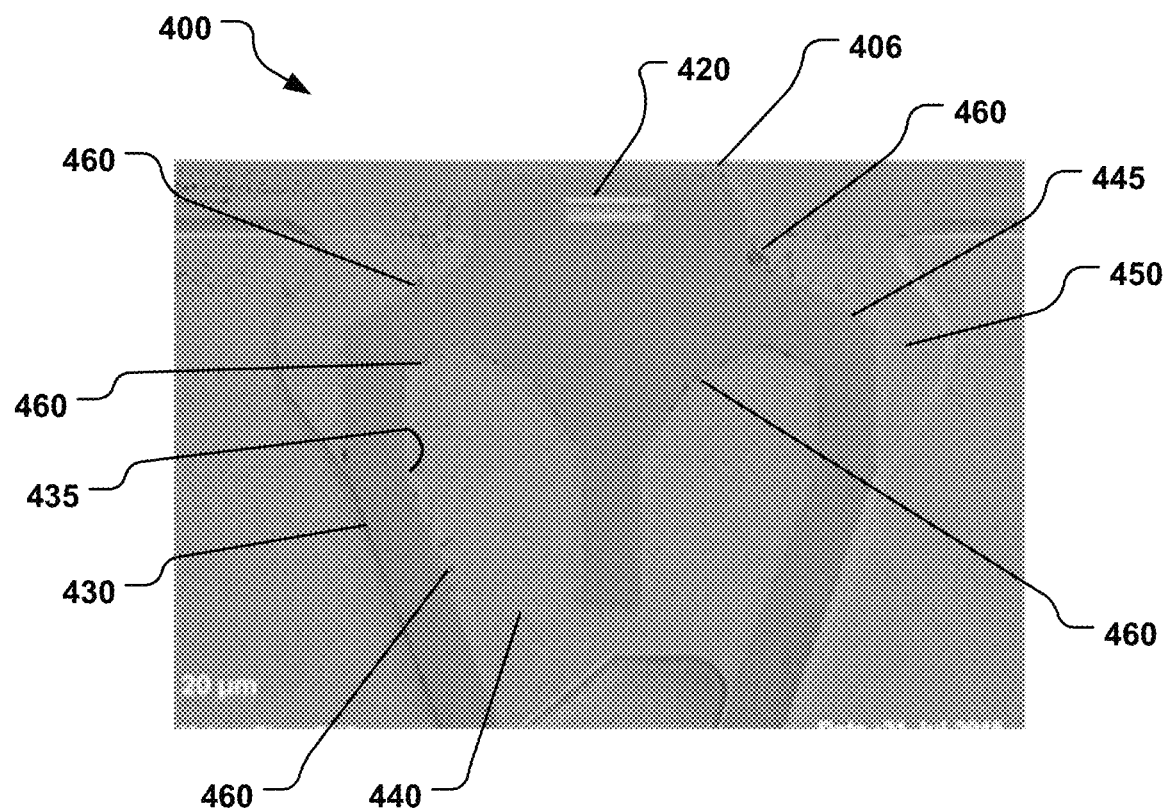
FIG. 4 is an enlarged view of a portion of a slider, such as the slider of FIG. 3.

FIG. 4 is a photomicrograph of an SEM image of a portion of a slider 400, similar to the slider 300 of FIG. 3, enlarged to show details. In FIG. 4, the trailing edge 406 of the slider 400 is shown, as well as the transducer 420 with a read head and a write head. Various topographical features can be seen in the photomicrograph of FIG. 4; region 430 is a raised or high region, region 440 is a recessed region, lower than the region 430, and region 450 is another recessed region, lower than the region 440. The regions 430, 440, 450 are formed by at least two different materials. For example, in one implementation, the region 430 is a diamond-like carbon (DLC) surface and each of the regions 440, 450 is an AlTiC surface. The DLC may be a coating over an AlTiC base, thus creating a height difference between the region 430 and the regions 440, 450. Because of the different material for the region 430 compared to the regions 440, 450, the surface potential of the region 430 is different than that of the regions 440, 450.

As seen in FIG. 4, debris 460 collects and accumulates at a boundary 435 of the region 430 and the region 440, and at a boundary 445 of the region 430 and the region 450. The debris 460 is seen to collect on the boundaries 435, 445 between two different material regions, which in FIG. 4, are boundaries that transition not only from one material to another by also from low to high topography when going from the leading edge of the slider to the trailing edge (e.g., boundary 435) and also from high to low topography (e.g., boundary 445). Although not shown in FIG. 4, (only because the structure of the slider is not so arranged), it is theorized that the debris 460 will collect and accumulate at any boundary between regions of two different materials, whether or not there is a difference in the surface height. This debris 460 can include particulate contaminant and droplets. The debris 460 is, in general, any polarizable particle, droplet, or other material or item. The presence of this debris 460 can be detrimental to the operation of the slider 400 when installed in a disc drive.

Figure 5:
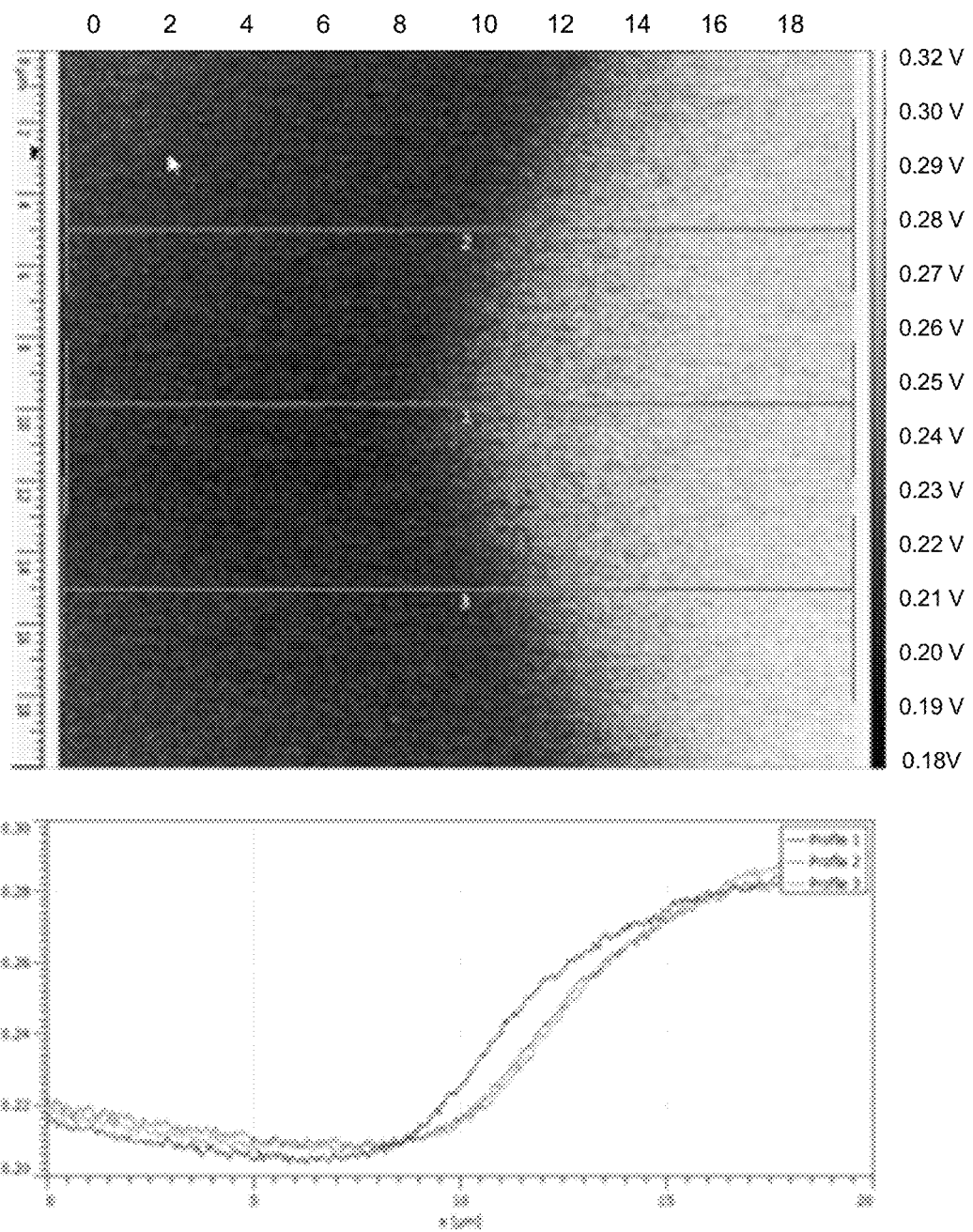
FIG. 5 is a graphical representation illustrating measured surface potential of a hydrophobic surface region of a slider and a hydrophilic region of the slider.

Because of the different surface material for the region 430 compared to the regions 440, 450, the surface potential of the region 430 is different than that of the regions 440, 450. FIG. 5 illustrates experimental results from a Kelvin Probe Atomic Force Microscope (KPFM) at a boundary such as the boundary 435 or boundary 445, where a DLC surface meets an AlTiC surface. In FIG. 5, the left side of the top graph (the black area) represents the DLC surface and the right side (the lighter area) represents the AlTiC surface. On the right side of the graph is the legend for the graph, showing that pure black represents a surface potential of 0.2 V and pure white represents a surface potential of 0.3 V. From the shading, the DLC (on the left side of the graph) has a surface potential in the range of 0.21 V to 0.22 V and the AlTiC (on the right side of the graph) has a surface potential about 0.3 V.

The lower graph of FIG. 5 graphs the surface potential (in V) for three DLC and AlTiC transition measurements (Profile 1, Profile 2, Profile 3). Debris has a tendency to collect in the trough (e.g., the low area) of the surface potential between the two materials.

Figure 6:
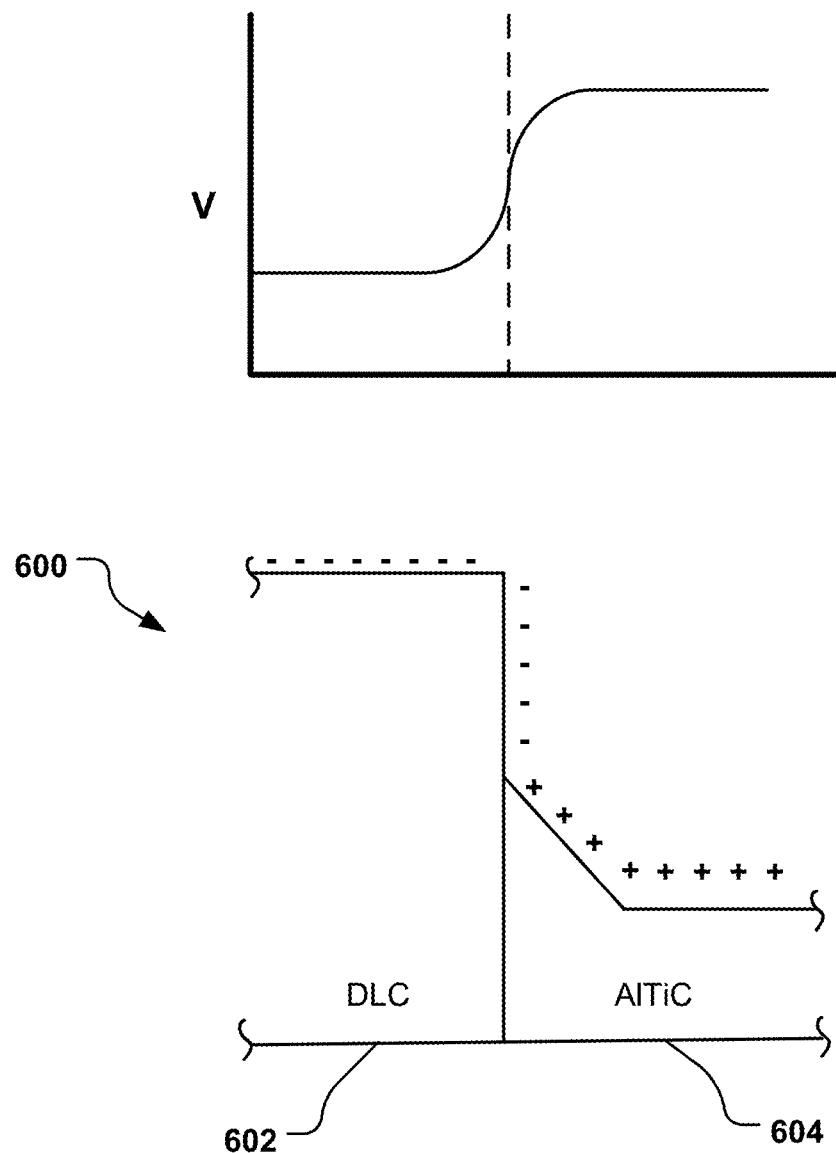
FIG. 6 is a graphical representation of surface potential for a region of a conventional slider.

FIG. 6 is a schematic illustration of the surface potential difference of a slider having two materials present at the surface. In FIG. 6, a slider 600 surface is schematically shown in side view having two portions of different materials, particularly, a DLC portion 602 and an AlTiC portion 604. The two figures of FIG. 6 are aligned so that the top figure shows the surface potential (in V) as a function of the side view topography of the lower figure. The vertical line in the top figure corresponds to the intersection between the DLC portion 602 and the AlTiC portion 604. This shows that the surface potential for the DLC portion 602 is significantly less than the surface potential for the AlTiC portion 604. Additionally, the DLC portion 602 has a negatively charged surface whereas the AlTiC portion 604 has a positively charged surface.

Based on the evidence (as shown in FIG. 4) that contaminant debris settles at the boundary between two different materials that have two different surface potentials, the present disclosure provides a continuous dielectric coating over the entire ABS of the slider, thus standardizing the surface potential of the slider surface. The coating has a constant thickness, varying by no more than 2 nm, and in other implementations no more than 1 nm.

Figure 7:
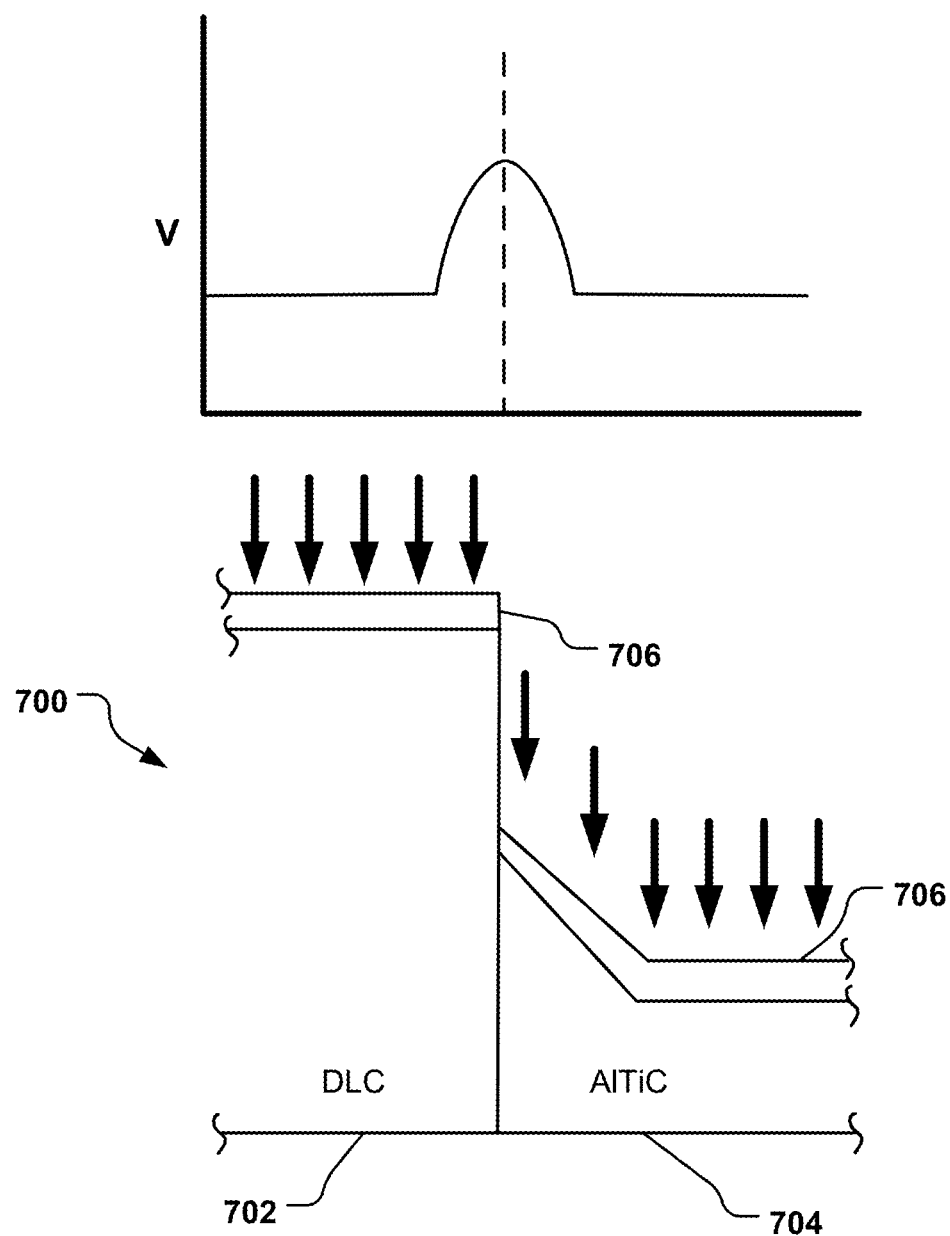
FIG. 7 is a graphical representation of surface potential for a region of a slider after having a coating applied thereto via physical deposition.

Similarly, FIG. 7 has two figures, the lower which is a schematic illustration of a slider having two materials but having a non-constant thickness coating thereon. In FIG. 7, a slider 700 surface is schematically shown in side view having two portions of different materials, particularly, a DLC portion 702 and an AlTiC portion 704 having a coating 706 (e.g., DLC) applied by a physical deposition process across both portions 702, 704 thereon. A physical deposition technique, as is well known, is subject to areas of the surface being shaded by a surface having a higher topography. The top figure graphically shows approximate surface potential of the slider 700. The two figures of FIG. 7 are aligned to show the surface potential (in V) as a function of the side view topography. The vertical line in the top figure corresponds to the intersection between the DLC portion 702 and the AlTiC portion 704. Although the physical deposition has provided a coating on both the DLC portion 702 and the AlTiC portion 704, the surface potential is not constant, due to the uneven thickness of the coating 706 and also the uncoated surface of DLC portion 702 (the vertical wall of the DLC portion 702, seen in the figure).

Figure 8:
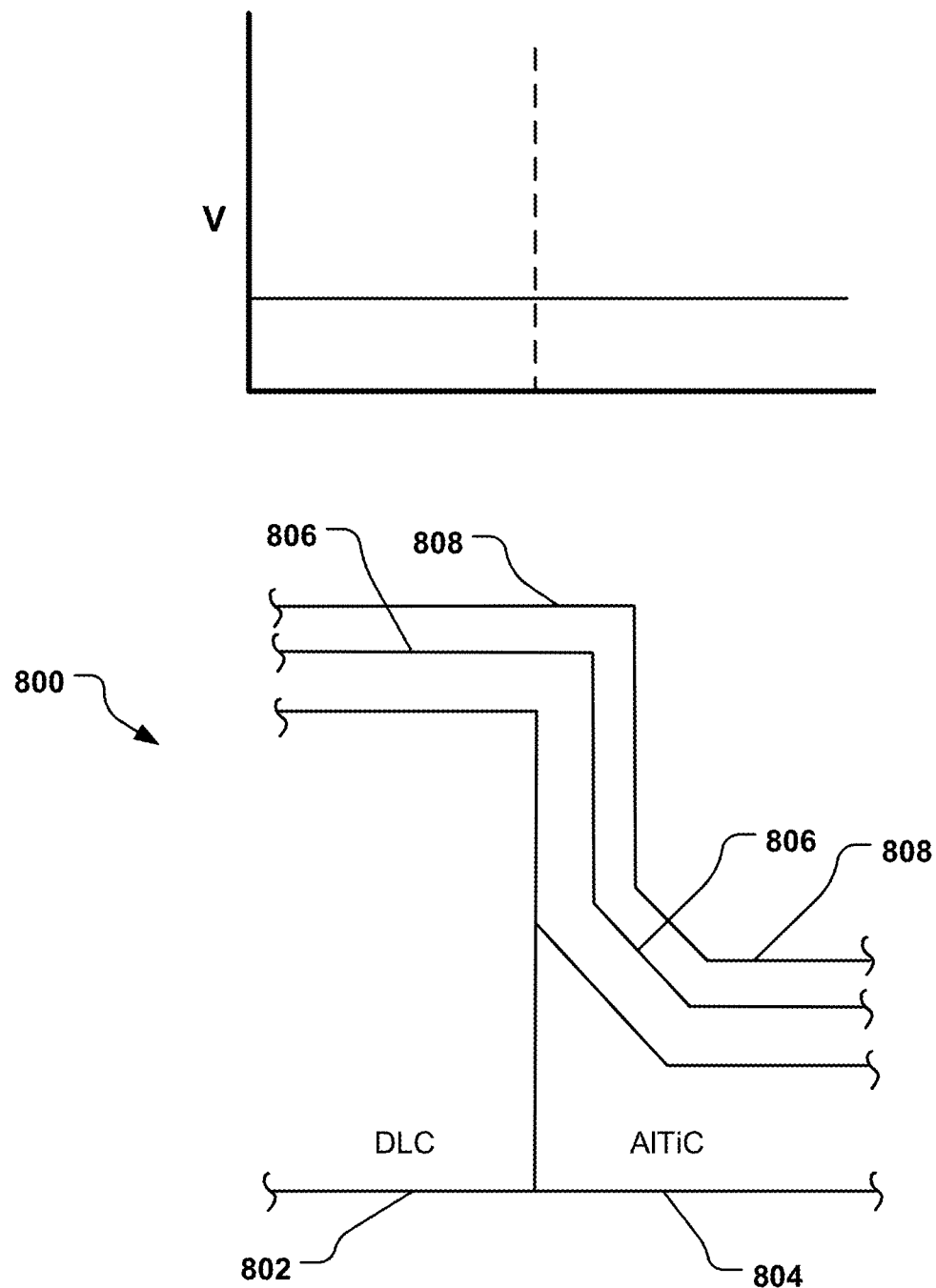
FIG. 8 is a graphical representation of surface potential for a region of a slider after having a coating applied thereto via conformal coating technique.

Similarly, FIG. 8 also has two figures, the lower of which is a schematic illustration of a slider formed with two materials at its surface but having a constant thickness coating thereon or thereover to provide an even or constant surface potential of the surface, the coating having been applied via a conformal coating process. In FIG. 8, a slider 800 surface is schematically shown in side view having two materials, particularly, a DLC portion 802 and an AlTiC portion 804, with a coating 806 (e.g., oxide) applied by a conformational coating process (e.g., ALD) thereon. The top figure graphically shows approximate surface potential of the slider 800. The two figures of FIG. 8 are aligned to show the surface potential (in V) as a function of the side view topography. The vertical line in the top figure corresponds to the intersection between the DLC portion 802 and the AlTiC portion 804. The conformal coating process has provided a consistent thickness coating 806 on both the DLC portion 802 and the AlTiC portion 804, so that the surface potential is consistent and continuous across the shown portions 802, 804. By use of the term "consistent," what is intended is that the surface potential varies by no more than 0.1 V. By use of the term "continuous," what is intended is that there is no break, void or deviation in the surface potential in the area where the coating 806 is present. By having a consistent surface potential across the ABS of the slider, the collection and/or accumulation of debris or other contaminant is inhibited, for, as evidenced by FIG. 4, the debris has a tendency to collect and accumulate where there is a change in surface potential.

Also present on the slider 800, in this implementation, is a self-assembled monolayer (SAM) coating 808 present over the entire coating 806. The terms "self-assembled monolayer," "SAM," and variants thereof, as used herein, refer to a thin monolayer of surface-active molecules provided (e.g., adsorbed and/or chemisorbed) on a surface to produce chemical bonds therebetween. Depending on the chemical nature of the SAM material, the SAM coating can further inhibit adherence of any contaminant to the slider, or, the SAM coating can attract and collect contaminants, for example, in a specific region of the slider. For example, a SAM coating 808 with an overall positive charge will readily attract negatively charged contaminants.

In some implementations, contaminants (e.g., oil(s), moisture, particles) are inhibited from attaching or otherwise attracting to the SAM coating. In other implementations, contaminants (e.g., oil(s), moisture, particles) are accumulated (e.g., coalesced) on the SAM coating. Often, when a sufficiently large droplet coalesces, the droplet may fall off from the surface and be removed from the immediate area of the slider by the air currents caused by the rotating media disc. In other situations, the amount of liquid contaminant is sufficiently small that no droplet forms during the working life of the disc drive assembly.

Any SAM coating or coatings can be applied to the slider ABS by any method conducive to applying SAM material onto the ABS or the protective overcoat.

As indicated above, the SAM material can be selected to repel or attract a particular contaminant or type of contaminant. Examples of contaminants that are common in disc drive assembles include alumina ($Al_2O_3$), talc, and hydrocarbons or hydrocarbon-based contaminants. For example, the alkylsilane class of SAM materials, such as n-decyltrichlorosilane and dodecyltrichlorosilane (DTS), can be used to remove hydrocarbon contaminants such as sebacate and blasocut oils (oils often present in spindle bearings), paraffins (often present in the media, adhesives, and plastics present within the disc drive housing), and tooling oil (which might be residual from the assembly process of the disc drive). A polar (strong fixed dipole) SAM, such as 3-aminopropyltrimethoxysilane, can be used to remove (e.g., adsorb or absorb) polar contaminants such as acidic gases (e.g., SOx, NOx), surfactants (soap) from upstream cleaning processes for the media, polar or statically charged particles (e.g., alumina particles, metal oxide particles, talc particles) and any moisture that might be present on the media.

The SAM coating is comprised of at least one SAM material. The coating can be oleophobic or oleophilic, hydrophobic or hydrophilic, etc., depending on the desired result from the SAM coating.

The phrase "oleophilic SAM" and variations thereof as used herein refers to a SAM having an oleophilic functional end group, such as saturated hydrocarbons. Other particular examples of suitable end groups include alkyls with 1-18 carbon atoms in addition to other unsaturated hydrocarbon variants, such as, aryl, aralkyl, alkenyl, and alkenyl-aryl. Additionally, materials with amine terminations, as well as carbon oxygen functional groups such as ketones and alcohols, will exhibit oleophilic properties.

The phrase "oleophobic SAM" and variations thereof as used herein refers to a SAM having an oleophobic functional end group, such as halosilanes and alkylsilanes. Particular examples of suitable halosilane and alkylsilane terminal groups include fluorinated and perfluorinated. In some implementations, an oleophobic SAM is also hydrophobic, thus being amphiphobic.

Prior to application of the SAM coating to the slider surface, e.g., on the conformal coating, the SAM molecules may have been present, for example, in a reaction solution or a reactive gas phase. The precursor compound for forming the SAM coating contains molecules having a head group and a tail with a functional end group. Common head groups include thiols, silanes with hydrolizable reactive groups (e.g., halides: {F, Cl, Br, I}, and alkoxys: {methoxy, ethoxy, propoxy}, phosphonates, etc. Common tail groups include alkyls with 1-18 carbon atoms in addition to other unsaturated hydrocarbon variants, such as, aryl, aralkyl, alkenyl, and alkenyl-aryl. In addition, the hydrocarbons materials listed above can be functionalized with fluorine substitutions, amine terminations, as well as carbon oxygen functional groups such as ketones and alcohols, etc., depending on the desired properties of the resulting SAM coating.

SAMs are created by chemisorption of the head groups onto the surface (i.e., the conformational (e.g., oxide or other) coating on the slider ABS surface) from either a vapor or liquid phase. The head groups closely assemble on the material with the tail groups extending away from the material. The self-assembled monolayer can be, for example, an organosilane (e.g. alkyl trichlorosilane, fluorinated alkyl trichlorosilane, alkyl trialkyloxysilane, fluorinated alkyl trialkyloxysilane, etc.).

The precursor compound of the SAM may be present in any conventionally-used organic solvent, inorganic solvent, water, or any mixture thereof. Examples of suitable organic solvents may include, but are not limited to, alcohols (e.g., methyl alcohol, ethyl alcohol, n-propyl alcohol, isopropyl alcohol, n-butyl alcohol, sec-butyl alcohol, t-butyl alcohol, isobutyl alcohol, and diacetone alcohol); ketones (e.g., acetone, methylethylketone, methylisobutylketone); glycols (e.g., ethyleneglycol, diethyleneglycol, triethyleneglycol, propyleneglycol, butyleneglycol, hexyleneglycol, 1,3-propanediol, 1,4-butanediol, 1,2,4-butantriol, 1,5-pentanediol, 1,2-hexanediol, 1,6-haxanediol); glycol ethers (e.g., ethyleneglycol dimethyl ether, and triethyleneglycol diethyl ether); glycol ether acetates (e.g., propylene glycol monomethyl ether acetate (PGMEA)); acetates (e.g., ethylacetate, butoxyethoxy ethyl acetate, butyl carbitol acetate (BCA), dihydroterpineol acetate (DHTA)); terpineols (e.g., trimethyl pentanediol monoisobutyrate (TEXANOL)); dichloroethene (DCE); chlorobenzene; and N-methyl-2-pyrrolidone (NMP).

An example of a commercially available SAM is 1H,1H, 2H,2H-perfluorodecyltrichlorosilane (also known as, hepta-decafluoro-1,1,2,2-tetrahydro-decyl-1-trichlorosilane) [CAS: 78560-44-8], which is in the general the class of fluorinated organosilanes. Other examples include trifluoropropyltrimethoxysilane, heneicosafluorododecyltrichlorosilane, nonafluorohexyltrimethoxysilane, methyltrichlorosilane, ethyltrichlorosilane, propyltrimethoxysilane, hexyltrimethoxysilane, n-octyltriethoxysilane, n-decyltrichlorosilane, dodecyltrichlorosilane, and octadecyltrichlorosilane.

Another example of a commercially available SAM is (3-aminopropyl)-trimethoxysilane [CAS: 13822-56-5], which is in the general class of organosilanes with amine, alcohol, or mercapto substituents. Other examples include (3-Mercaptopropyl)trimethoxysilane, methyl 11-[dichloro(methyl)silyl]undecanoate, acetoxyethyltrichlorosilane, and vinyltriethoxysilane.

Examples of oleophilic SAM materials fall within the general class of 1-18 carbon alkylsilanes with a hydrolyzable reactive group (e.g., F, Cl, Br, and I) and an alkoxy (e.g., methoxy, ethoxy, and propoxy) include methyltrichlorosilane, ethyltrichlorosilane, propyltrimethoxysilane, hexyltrimethoxysilane, n-octyltriethoxysilane, n-decyltrichlorosilane, dodecyltrichlorosilane, and octadecyltrichlorosilane. In addition to the alkyl class, other functional SAMs, such as the following, are also are advantageous: 3-aminopropyltrimethoxysilane, methyl 11-[dichloro(methyl)silyl]undecanoate, acetoxyethyltrichlorosilane, vinyltriethoxysilane, and nonafluorohexyltrimethoxysilane.

In some implementations, particularly for silane-containing SAM materials, the SAM material has a carbon chain having no more than 18 carbon atoms; SAM materials having a carbon chain with 10 carbon atoms or 12 carbon atoms are examples.

SAM materials are widely available in a range of surface energies. Self-assembled monolayer materials can have a low surface energy or a high surface energy. The term "low surface energy" and variations thereof, as used herein, refers to the tendency of a surface to resist wetting (high contact angle) or adsorption by other unwanted materials or solutions; whereas, "high surface energy" refers to the tendency of a surface to increase or promote wetting (low contact angle) or adsorption by other unwanted materials or solutions. In a low surface energy material, such as a low energy SAM, the functional terminal groups of the molecules are chosen to result in weak physical forces (e.g., Van der Waals forces) between the coating and a liquid and thus allow for partial wetting or no wetting of the resulting coating (i.e., a high contact angle between the liquid and the coating). Conversely in a high surface energy material, such as a high energy SAM, the functional terminal groups of the SAM molecules are chosen to result in a stronger molecular force between the coating and a liquid and allow for full wetting of the of the liquid (i.e., a very small contact angle between the liquid and the coating). Values that are typically representative of "low surface energy" are in the range of 5-30 dyne/cm and high surface energy materials are relatively higher than this range, typically anything greater than 30 dyne/cm. An example of a high energy self-assembled monolayer or SAM material includes 3-aminopropyltrimethoxysilane. Examples of low energy self-assembled monolayer or SAM materials include perfluorodecyltrichlorosilane (FDTS) and other fluorinated organosilane derivatives.

The SAM material may occupy the entire ABS of the slider or only a portion thereof. In some implementations, the SAM material occupies at least 50% of the ABS, in other implementations at least 75% of the ABS. One or more SAM materials may be present on the ABS; these may be present in any pattern or may be randomly on the ABS. Additionally or alternately, the SAM material may cover the entire conformal coating or only a portion thereof. In some implementations, the SAM material occupies at least 50% of the conformal coating, in other implementations at least 75% of the conformal coating. If multiple SAM materials are present, they may differ by any of surface potential or by chemical composition (e.g., fluorinated versus non-fluorinated).

Occasionally, the SAM coating can be refreshed or recharged; that is, the accumulated contaminant(s) are removed and/or new SAM material is applied. This may be done, for example, during scheduled maintenance of the disc drive assembly, or when the assembly is repaired or otherwise maintained or serviced. Accumulated contaminants, that did not fall off from the slider themselves, can be removed, for example, by a wipe, air knife, under high heat or by a plasma process. After the contaminants are removed, the SAM material can be replenished if needed. For example, after attracting contaminants on the cleaning surface, the cleaning surface can be recharged by subsequent cleaning or reactivation of the cleaning surface through either (for example) solution or plasma based cleaning processes, and then reapplication of the SAM coating.

As described above and illustrated in the figures, the present disclosure is directed to various implementations for managing the accumulation of contaminants, including lubricant and other organic contaminants, on the slider surface, by providing a coating on the ABS to provide a constant surface potential across the ABS. A SAM coating may be provided on a portion of or all of the constant surface potential coating.

The above specification and examples provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about," whether or not the term "about" is immediately present. Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Spatially related terms, including but not limited to, "bottom," "lower", "top", "upper", "beneath", "below", "above", "on top", "on," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A slider comprising:
   an air-bearing surface (ABS) having a first area comprising a first material and a first surface energy, and a second area comprising a second material different than the first material and a second surface energy different than the first surface energy;
   a constant-thickness oxide coating having a consistent and continuous surface energy across the first area and the second area; and
   a self-assembled monolayer (SAM) coating on the oxide coating.

2. The slider of claim 1, wherein the oxide coating is $SiO_2$.

3. The slider of claim 1, wherein the oxide coating has a thickness no greater than 200 nm.

4. The slider of claim 1, wherein the first material is AlTiC and the second material is DLC.

5. The slider of claim 1, wherein the first area is recessed in relation to the second area.

6. The slider of claim 1, wherein the surface energy differs by no more than 0.1 V across the at least one recessed area and the at least one raised area.

7. The slider of claim 1, wherein the oxide coating is across the entire ABS.

8. A slider comprising:
   an air-bearing surface (ABS) comprising a first material and a second material different than the first material, the first material having a different surface energy than the second material; and
   a dielectric coating having a thickness of 0.5 to 50 nm over the first material and the second material of the ABS, the coating providing a surface energy that varies by no more than 0.1 V across the ABS.

9. The slider of claim 8; further comprising a self-assembled monolayer (SAM) coating on the dielectric coating.

10. The slider of claim 8, wherein the first material is in a recessed area and the second material is in a raised area compared to the recessed area.

11. The slider of claim 10, wherein the first material is AlTiC.

12. The slider of claim 10, wherein the second material is DLC.

13. The slider of claim 8, wherein the dielectric coating has a constant thickness.

14. The slider of claim 8, wherein the dielectric coating is over the entire ABS.

15. A method of making a slider, the slider having a body with an air-bearing surface (ABS) having a topography including recessed areas and raised areas and first areas comprising a first material and second areas comprising a second material, the method comprising:
   applying an oxide coating via an atomic layer deposition (ALD) process on the first areas comprising the first material and on the second areas comprising the second material; and
   applying a self-assembled monolayer (SAM) coating on the oxide coating.

16. The method of claim 15, wherein the first material is in the recessed areas and the second material is in the raised areas.

17. The method of claim 15, wherein the oxide coating has a thickness no greater than 200 nm.

18. The method of claim 15, wherein the oxide coating has a thickness that varies no more than 2 nm.

19. The method of claim 15, wherein the first material is AlTiC and the second material is DLC.

* * * * *